US007188274B2

(12) United States Patent
Nadeau-Dostie et al.

(10) Patent No.: US 7,188,274 B2
(45) Date of Patent: Mar. 6, 2007

(54) MEMORY REPAIR ANALYSIS METHOD AND CIRCUIT

(75) Inventors: Benoit Nadeau-Dostie, Gatineau (CA); Robert A. Abbott, Ottawa (CA)

(73) Assignee: LogicVision, Inc., San Jose, CA (US)

( * ) Notice: Subject to any disclaimer, the term of this patent is extended or adjusted under 35 U.S.C. 154(b) by 565 days.

(21) Appl. No.: 10/774,512

(22) Filed: Feb. 10, 2004

(65) Prior Publication Data
US 2004/0163015 A1    Aug. 19, 2004

Related U.S. Application Data

(60) Provisional application No. 60/447,280, filed on Feb. 14, 2003.

(51) Int. Cl.
*G06F 11/00* (2006.01)
(52) U.S. Cl. .......................................... 714/6; 714/710
(58) Field of Classification Search ..................... 714/6, 714/7, 710, 711
See application file for complete search history.

(56) References Cited

U.S. PATENT DOCUMENTS

| | | | |
|---|---|---|---|
| 5,561,636 A * | 10/1996 | Kirihata et al. ............. | 365/201 |
| 6,067,259 A * | 5/2000 | Handa et al. ............... | 365/200 |
| 6,076,176 A | 6/2000 | Priore et al. | |
| 6,297,997 B1 * | 10/2001 | Ohtani et al. ............... | 365/201 |
| 6,408,401 B1 | 6/2002 | Bhavsar et al. | |
| 6,625,072 B2 * | 9/2003 | Ohtani et al. ............... | 365/200 |

OTHER PUBLICATIONS

Nakahara et al, "Built-In Self-Test for GHz embedded SRAMS Using Flexible Pattern Generator and New Repair Algorithm", 1999 Proceedings of the International Test Conference, Oct. 1999, p. 301.
McConnell et al., "Test Repair of Large Embedded DRAMs: Part 1", Proceedings International Test Conference 2001, Oct. 30-Nov. 1, 2001, Baltimore, Maryland p. 163.
Schober, et al., "Memory Built-In Self-Repair", 2001 Proceedings of the International Trade Conference, Oct. 30-Nov. 1, 2001, p. 995.
Kwon et al., "Linear Search Algorithm for Repair Analysis with 4 Spare Row/4 Spare Column", Proceedings of the 2nd IEEE Asia-Pacific Conference on ASIC, Cheju Island, Korea, Aug. 28, 2000, paper 15.1.

* cited by examiner

*Primary Examiner*—Dieu-Minh Le
(74) *Attorney, Agent, or Firm*—Eugene E. Prouix

(57) ABSTRACT

A method and circuit for repairing a memory array having one or more memory segments each having one spare column and a predetermined number of spare rows common to all segments, the method comprises, while testing the memory array for failures, generating an equal number of unique segment repair solutions for each segment with each segment repair solution including one defective column address, if any, and a number of defective row addresses, if any, corresponding to the predetermined number of spare rows; and, after completing testing, analyzing all segment repair solution combinations consisting of one segment repair solution selected from each segment; and identifying the best segment repair solution combination of combinations having a number of different defective row addresses which is less than or equal to the predetermined number of spare rows.

46 Claims, 11 Drawing Sheets

MEMORY REPAIR ANALYSIS METHOD AND CIRCUIT

CROSS-REFERENCE TO RELATED APPLICATIONS

This application claims the benefit of U.S. Provisional Patent Application Ser. No. 60/447,280 filed Feb. 14, 2003.

BACKGROUND OF THE INVENTION

1. Field of the Invention

The present invention generally relates to the design of integrated circuits and, more specifically, to testing and repairing of memory arrays in integrated circuits.

2. Description of Related Art

Memory components such as random access memories (RAM) are widely available in very high densities. It would be extremely cost inefficient to discard an entire integrated circuit chip simply because of the failure of a single memory cell in a memory. Accordingly, It is known to include circuitry which can both detect failures in a memory and also repair a defective memory. To facilitate providing repairable memory arrays, it is also known to divide such memories into segments. Each segment may be organized as a set of columns. Various methods have been devised for repairing memory arrays. The drawbacks of existing methods are that they require large chip area and repair reduces repair speed from that which would otherwise be desirable.

Kwon et al. in a paper entitled "Linear Search Algorithm for Repair Analysis with 4 Spare Row/4 Spare Column", published as paper 15.1 in the proceedings of the IEEE Asia-Pacific Conference on ASIC, Cheju Island, Korea, Aug. 28th, 2000, discloses a method of repair analysis for repairing a RAM block, using four spare rows and four spare columns, implemented with CAM (Content Addressable Memory) that has the functions of data-match, count-sub-entry, search-empty-entry. The primary feature of the method is on-the-fly repair analysis by re-arrangement of CAM array contents and repair analysis processing by one row or one column unit with a dual error buffer.

A Schöber et al. paper entitled "Memory Built-In Self-Repair" describes a word oriented memory test methodology for Built-In Self-Repair (BISR) published in the 2001 Proceedings of the International Test Conference, October, 2001, p. 995. The method contains memory BIST logic, wrapper logic to replace defective words, and fuse boxes to store failing addresses to allow the use of RAMs without spare rows and spare columns used in classic redundancy concepts. Faulty addresses and expected data are stored in redundancy logic immediately after detection. The BISR adds faulty words to the redundancy logic as long as spare words are available to avoid external or internal redundancy calculation. It is possible to add faulty addresses to faults that have been detected during former runs. The memory test allows a memory BISR even if parts of the redundancy are already configured. The fuse box can be connected to a scan register to stream in and out data during test and redundancy configuration.

A Nakahara et al. paper, entitled "Built-in Self-test For GHz Embedded SRAMs Using Flexible Pattern Generator And New Repair Algorithm", published in the 1999 Proceedings of the International Test Conference (ITC), Sep. 28, 1999, p. 301, discloses a built-in self-test (BIST) scheme which consists of a flexible pattern generator and an on-macro two-dimensional redundancy analyzer, for GHz embedded SRAMs. In order to meet system requirements and to detect a wide variety of faults or performance degradation resulting from recent technology advances, a microcode-based pattern generator is used to generate flexible patterns.

Bhavsar et al. U.S. Pat. No. 6,408,401 granted on Jun. 18, 2002 for "Embedded Ram with Self-test and Self-repair with Spare Rows and Columns" discloses a self-repair method for a random access memory (RAM) array which comprises testing a memory array to identify faulty memory cells in the memory array. An address of a newly-discovered faulty memory cell is compared to at least one address of at least one previously-discovered faulty memory cell. The address of the newly discovered faulty memory cell is stored if a column or row address of the newly-discovered faulty cell does not match any column or row address, respectively, of a previously-discovered faulty memory cell. Flags are set to indicate that a spare row or a spare column must replace the row or column, respectively, identified by the address of the previously-discovered faulty memory cell, if the row or column address of the newly-discovered memory cell matches the respective row or column address of the previously-discovered faulty memory cell. Spare rows and columns that have been indicated by the flags as requiring replacement are allocated to replace faulty rows and columns respectively. The remaining spare rows and columns whose row and column addresses respectively have been stored are then allocated. The RAM is flagged as unrepairable if an insufficient number of spare rows or spare cells remain to replace all of the rows or columns containing faulty cells.

Priore et al. U.S. Pat. No. 6,076,176 granted on Jun. 13, 2000 for "Encoding of Failing Bit Addresses to Facilitate Multi-bit Failure Detect Using a Wired-or Scheme" discloses a technique for encoding failing bit addresses in a memory array with redundant portions such as column slices. The address or other identification of a column slice or other portion of a memory array is identified to test logic using a wired-OR bus configuration. The technique assigns a code consisting of predetermined number of asserted bits to each portion of the memory. If a failure condition is detected, the code associated with that portion is asserted onto the bus. Because the code for each memory portion always has a given number of asserted bits, a multi-bit failure situation can be distinguished from a single bit failure situation by counting the number of bits asserted.

SUMMARY OF THE INVENTION

The present invention seeks to provide a memory array self-repair circuit and method which minimize area required to implement the self-repair circuit and maximize the speed at which self-repair is achieved.

One aspect of the present invention is defined as a circuit for use in repairing memory arrays having one or more memory segments each having one spare column and a predetermined number of spare rows common to all segments, the circuit comprising an analysis circuit for analyzing failures detected during testing of the memory array and for generating segment repair solutions for each segment; the analysis circuit having registers for storing addresses of selected failures for each segment repair solution, the registers including row address registers for storing row addresses of rows having a failure and one column address register for storing a column address of a column having a selected failure; the analysis circuit being operable to store row addresses and one column address in a unique order in segment repair solutions associated with the same segment;

and a segment repair solution processing circuit for identifying a best segment repair solution combination, consisting of one segment repair solution from each segment, having a number of different defective row addresses which is less than or equal to the predetermined number of spare rows, the best segment repair solution combination identifying rows and columns to be replaced by the spare rows and the spare column in each segment.

Another aspect of the present invention is defined as a method of repairing a memory array having one or more memory segments each having one spare column and a predetermined number of spare rows common to all segments, the method comprising, while testing the memory array for failures, generating an equal number of unique segment repair solutions for each segment, each segment repair solution including one defective column address, if any, and a number of defective row addresses, if any, corresponding to the predetermined number of spare rows; and, after completing testing, analyzing all combinations of segment repair solutions in which each combination includes one segment repair solution selected from each segment; and identifying a best segment repair solution combination, consisting of one segment repair solution from each segment, having a number of different defective row addresses which is less than or equal to the predetermined number of spare rows, the best combination identifying rows and columns to be replaced by the spare rows and the spare column in each segment.

BRIEF DESCRIPTION OF THE DRAWINGS

These and other features of the invention will become more apparent from the following description in which reference is made to the appended drawings in which.

DETAILED DESCRIPTION OF EMBODIMENTS OF THE INVENTION

Figure 1:
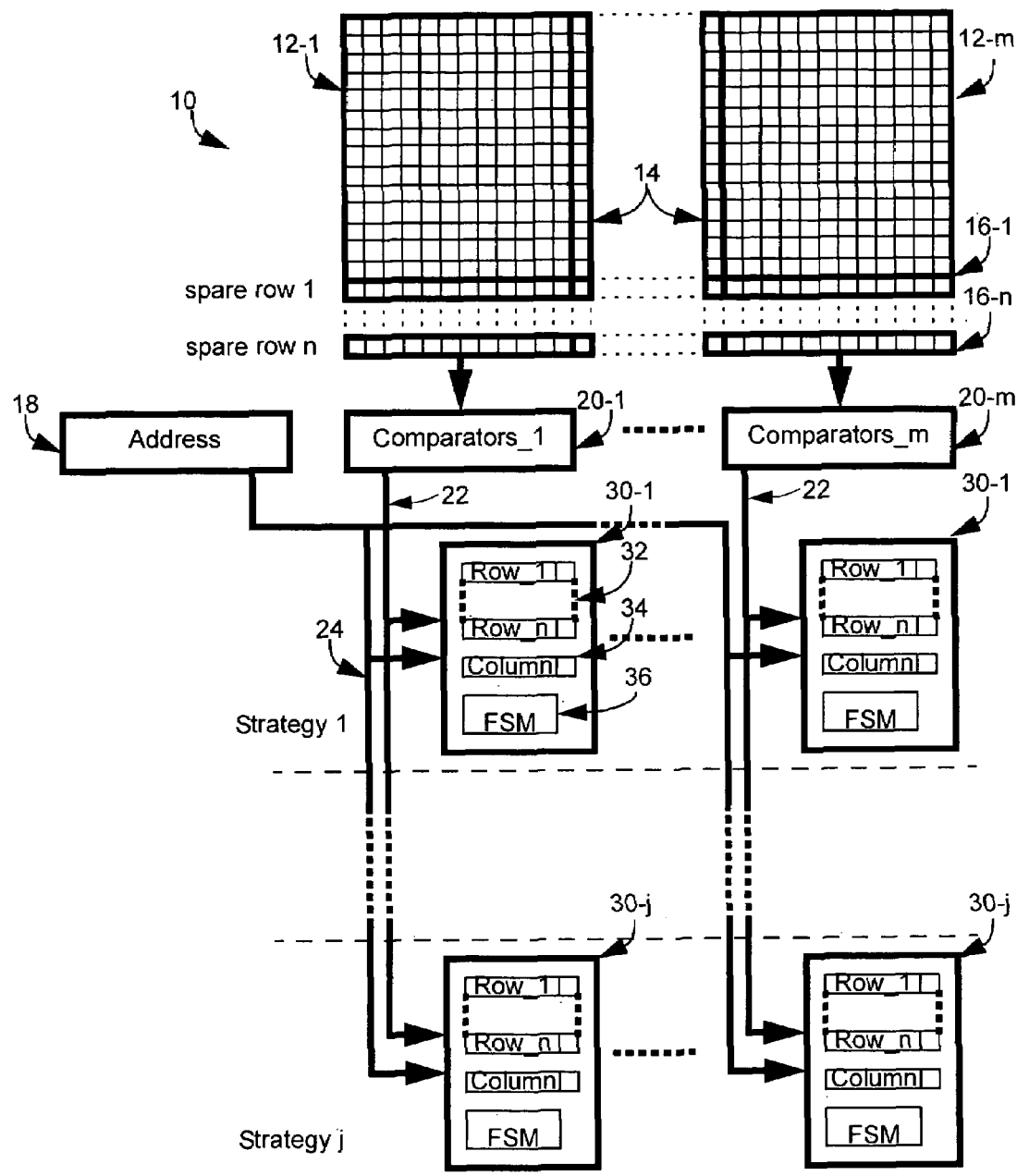
FIG. 1 illustrates the general architecture of memory block repair analysis circuit according to an embodiment of the present invention.

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

By way of overview, the present invention provides a circuit and a method for use in repairing memory arrays having one or more memory segments each having one spare column and a predetermined number of spare rows. The method generally involves two phases. The first phase is performed during testing of the memory array. During this phase, one or more segment repair solutions are developed for each segment. The second phase is performed after the testing has been completed. During the second phase, all combinations of the segment repair solutions are analyzed to determine which, if any, form a memory array repair solution. Any memory repair solutions identified are then weighted to determine which forms the best memory array repair solution.

A preferred embodiment of the present invention provides a circuit for use in repairing a memory arrays having one or more memory segments each having one spare column and a predetermined number of spare rows common to all segments. The circuit comprises at least one segment repair engine associated with each segment for analyzing failures detected during testing of a memory array and for generating a segment repair solution. Each repair engine has registers for storing addresses of selected failures. A selected failure, also referred to herein as a "new" failure, is a failure which has a row address which is different from that of all previously stored row addresses for a segment and its column address is different from that of a previously stored column address for the segment. The registers include row address registers, corresponding in number to the predetermined number of spare rows, and one column address register. The segment repair engines are logically identical, are operable to execute any of a predetermined number of different repair strategies and are responsive to a repair strategy parameter applied thereto prior to a memory test. The parameter indicates a number of row addresses to store before storing a column address of its associated segment.

The circuit also includes a segment repair solution processing circuit for identifying the best segment repair solution combination, consisting of one segment repair solution from each segment, having a number of different defective row addresses which is less than or equal to the predetermined number of spare rows. The best combination identifies rows and columns to be replaced by the spare rows and the spare column in each segment. The foregoing and other features will be better understood with reference to the accompanying drawings.

FIG. 1 illustrates the general architecture of the circuit used for repair analysis of a memory block or array 10, according to an embodiment of the present invention. Memory block 10 has a number of rows and columns organized into segments or column groups. In the present description, the terms segment and column group are used interchangeably. The memory block has a number, m, of identical segments, including a first segment 12-1 and a last segment 12-m. Each segment has exactly one spare column (or column block) 14 and shares a number, n, of spare rows (or row blocks) with all other segments. The first spare row block is labeled 16-1 and the last spare row is labeled 16-n.

Comparators blocks 20-1 to 20-m are associated with segments 12-1 to 12-m, respectively. The comparators blocks compare the respective segment output against expected data provided by a memory test controller (not shown). Each comparator has a composite output 22 which consists of a failure flag, a multiple failure flag and a column address. The failure flag indicates that a failure occurred in the segment. The column address of the failing column is preferably encoded as a binary number. Typically, several columns are accessed at the same time. If a failures have occurred in multiple columns, the comparator sets the multiple failure flag. The binary number encoding the position of the failing column is invalid when the multiple failure flag is set.

A number, j, of repair analysis engines 30-1 to 30-j are associated with a column group. The maximum number of repair analysis engines is one more than the predetermined number of spare rows. Each repair engine generates a segment repair solution as explained below. Each repair engine receives the output of the associated segment comparators block. The repair engines also receive the output of address counter 18. The address counter indicates the row and column address of a memory word accessed during a memory test. Each engine is provided with a number, n, of row registers 32, one column register 34, and a finite state machine (FSM) 36. Each row register can store the address of a row (or block of rows) in which a failure occurred. Replacing this row by one of the spare rows would avoid some (or all) of the failures identified during a memory test. One bit of the register, an allocation bit, indicates whether the contents of the row register is valid. Similarly, the column register can store the address of a column in which a failure occurred. Replacing this column by the spare column would avoid some (or all) of the failures identified during the memory test. The column register also has an allocation bit. FSM 36 is a circuit which implements a repair analysis algorithm illustrated in FIGS. 3 and 4. The FSM also contains a status register (not shown) which stores one of three values for the associated strategy or engine: "no repair needed", "repairable" and "non-repairable". The status values are used during a post-testing phase of the method of the present invention and is described later.

Each repair analysis engine implements a different repair strategy numbered 1 to j. A repair strategy consists of storing the defective row addresses and a column address in a certain or unique order with respect to the other repair strategies of a segment. The repair strategies are described in more detail in the description of the repair analysis engine flow diagram of FIG. 4.

It will be understood by those skilled in the art that the circuitry of the present invention may comprise individual engines as described herein, or may be a single circuit per segment which performs all of the strategies of the segment or a single circuit which performs all strategies for all segments.

Figure 2:
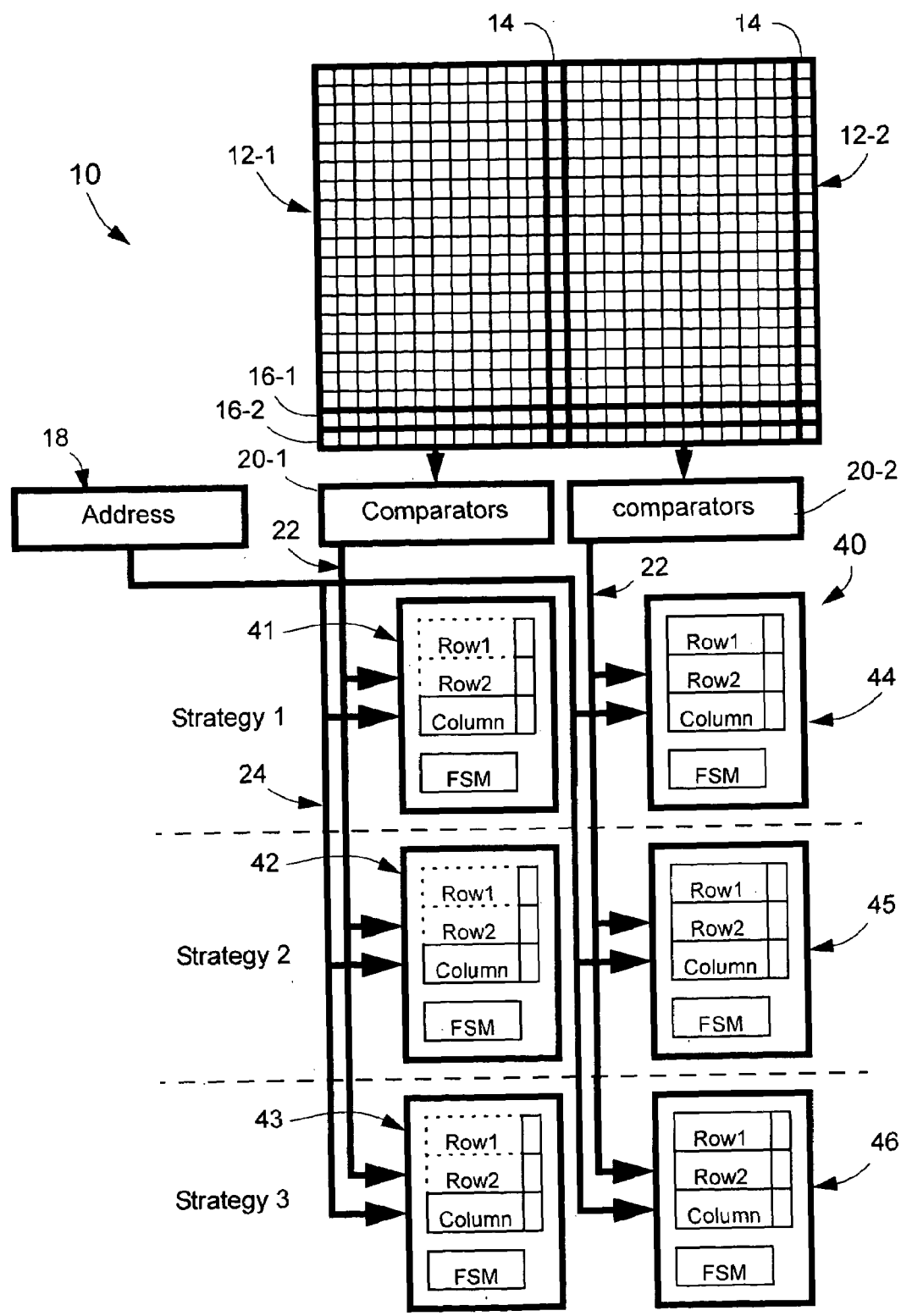
FIG. 2 illustrates an embodiment of the present invention in which the number of spare rows (or block of rows) n is set to 2, the number of spare columns (or block of columns) m is set to 2 and the number of repair strategies j is set to 3.

FIG. 2 illustrates an example circuit in which memory 10 is partitioned into two segments, the number of spare rows (or block of rows) n is set to 2, the number of spare columns (or block of columns) m is set to 2, one spare column for each of the two segments, and the number of repair strategies, j, is set to 3. One repair engine is provided for each repair strategy and, thus, three repair engines are provided for each memory segment, repair engines 41, 42 and 43 are associated with segment 12-1 and repair engines 44, 45 and 46 are associated with segment 12-2. The number of repair engines is one more than the maximum number of possible strategies that can be employed to repair a segment. A smaller number of repair engines/strategies may be employed if desired to reduce area consumption.

Each repair engine has two row registers, corresponding to the number of spare rows, and one column register corresponding to the spare column of the associated memory segment. Each register has one allocation bit, indicating whether a valid address has been stored its associated register, i.e., used in a repair strategy. For convenience, segments 12-1 and 12-2 will hereinafter be referred to as segment 1 and segment 2, respectively.

The row registers of the repair engines associated with the first segment are shown as dotted lines to indicate that the row registers may be shared among repair engines which implement a common strategy. The shared row registers physically reside in the repair engines associated with segment 2, although the registers could also reside in the repair engines associated with segment 1 or elsewhere in the repair analysis circuit. Each repair engine still behaves as if the shared row registers were exclusive to it, as shown in FIG. 1. Thus, it will be appreciated that a repair engine might run out of row resources without having used any resources itself. The allocation bit associated with each row register is under exclusive control of its associated repair engine. That is, each repair engine indicates whether it would have allocated the row indicated in the shared row register even if it did not allocate it itself.

Figure 10:
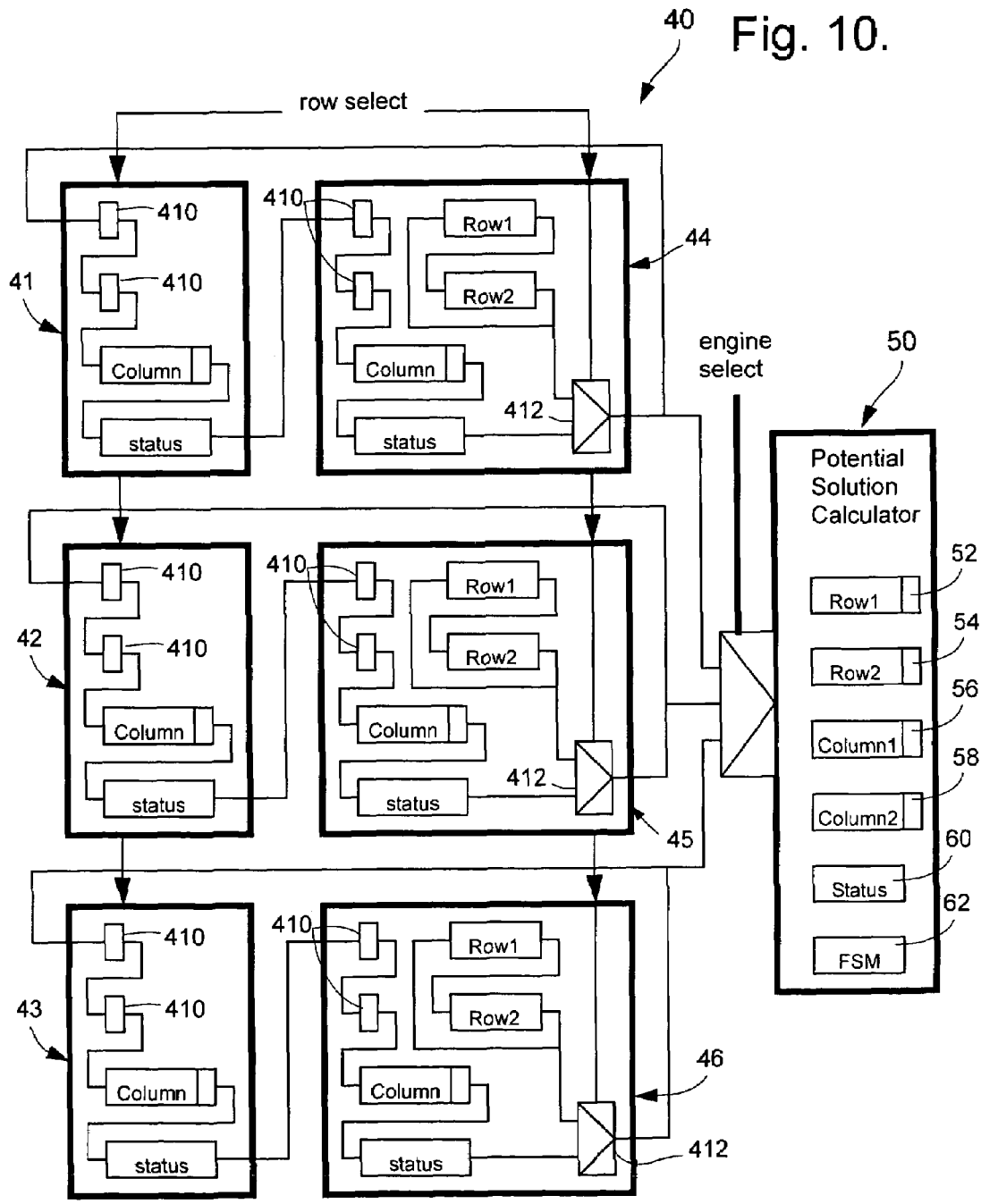
Figure 11:
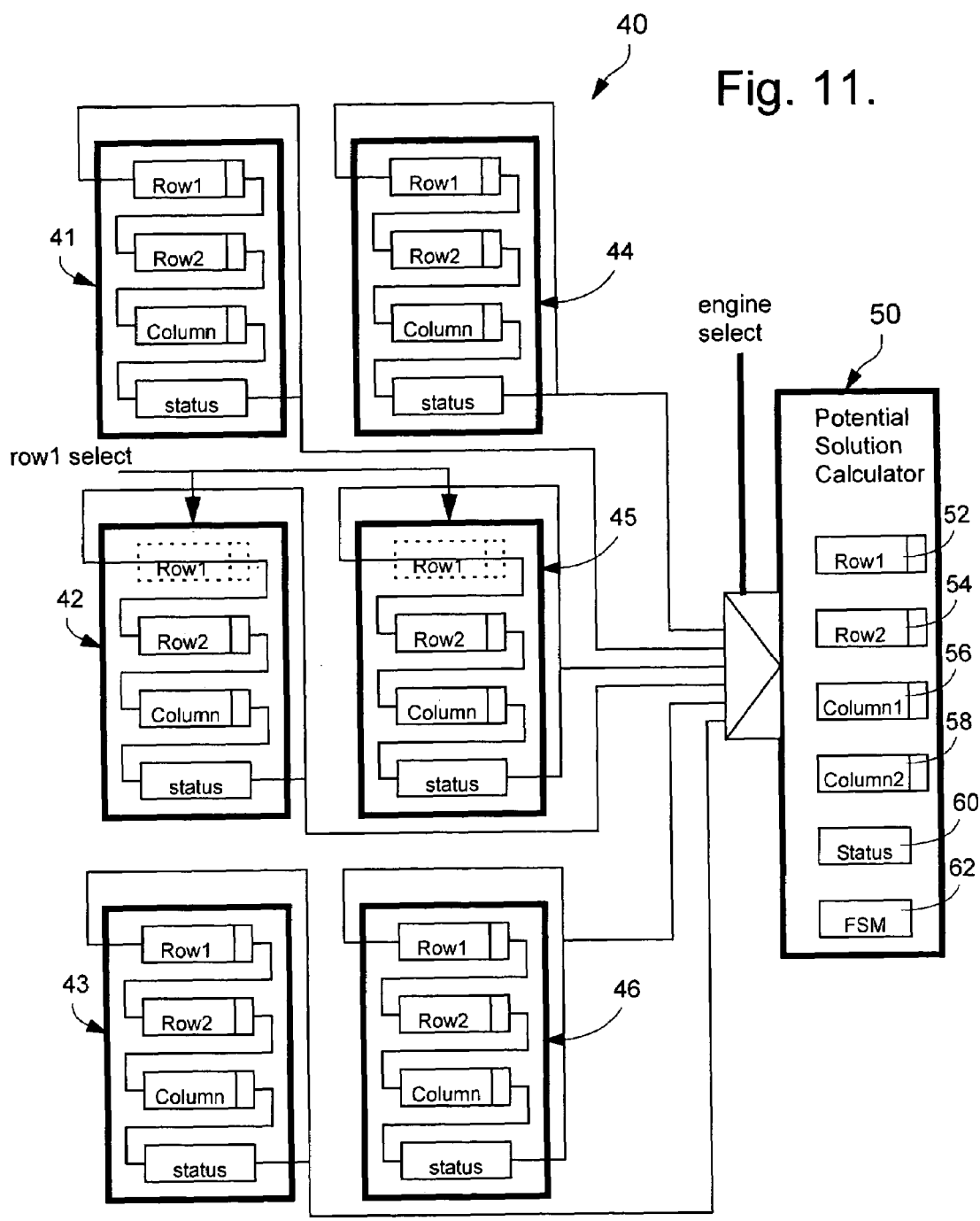

Strategies using shared row registers might not find a repair solution even though a repair solution theoretically exists. However, less circuitry is required to implement repair engines using a shared approach and, therefore, the approach provides a trade-off between efficiency and circuit area. Row registers can also be shared within a column group for additional circuit area savings. FIGS. 10 and 11, described later, illustrate shared row embodiments in more detail.

In the example of FIG. 2, there are three possible strategies: RRC (K=2), RCR (K=1) and CRR (K=0). The first strategy consists of allocating the two spare rows before allocating the spare column. The second strategy consists of allocating only one spare row before allocating the spare column and then allocating the last spare row. The third strategy consists of allocating the spare column first and then the two spare rows. The Row1 register of the repair engines implementing strategy 1 and strategy 2 (RRC and RCR) can be shared because they will always contain the same information. More savings can be achieved when more spare rows are used. In general, for N spare rows, a saving of 1+2+ . . . +N−1 registers can be achieved.

It will be understood that not all registers will contain valid row and/or column addresses upon completion of a memory test. Some segments will be free of failures and, therefore, the column register and row registers will not contain valid addresses. This will be indicated by the allocation bits being inactive. Some segments may need repair, but the number of failures may not be sufficient to fill all of the address registers. Some segments may have more failures than can be stored in the registers available. Such segments are considered non-repairable.

In summary, while testing the memory array for failures, an equal number of unique segment repair solutions are generated for each segment by the segment repair analysis engines. Each segment repair solution generated by a repair engine will include one column address and a number of row addresses corresponding to the predetermined number of spare rows. The generation of segment repair solutions includes storing a column address or a row address of each new failure detected and storing a unique number of defective row addresses before storing a defective column address to a maximum of the number of row addresses and the column address. As indicated earlier, the unique number ranges from 0 to j, where 0 means that the spare column is allocated first, 1 means that one spare row is allocated before allocating the spare column, and so on.

Figure 3:
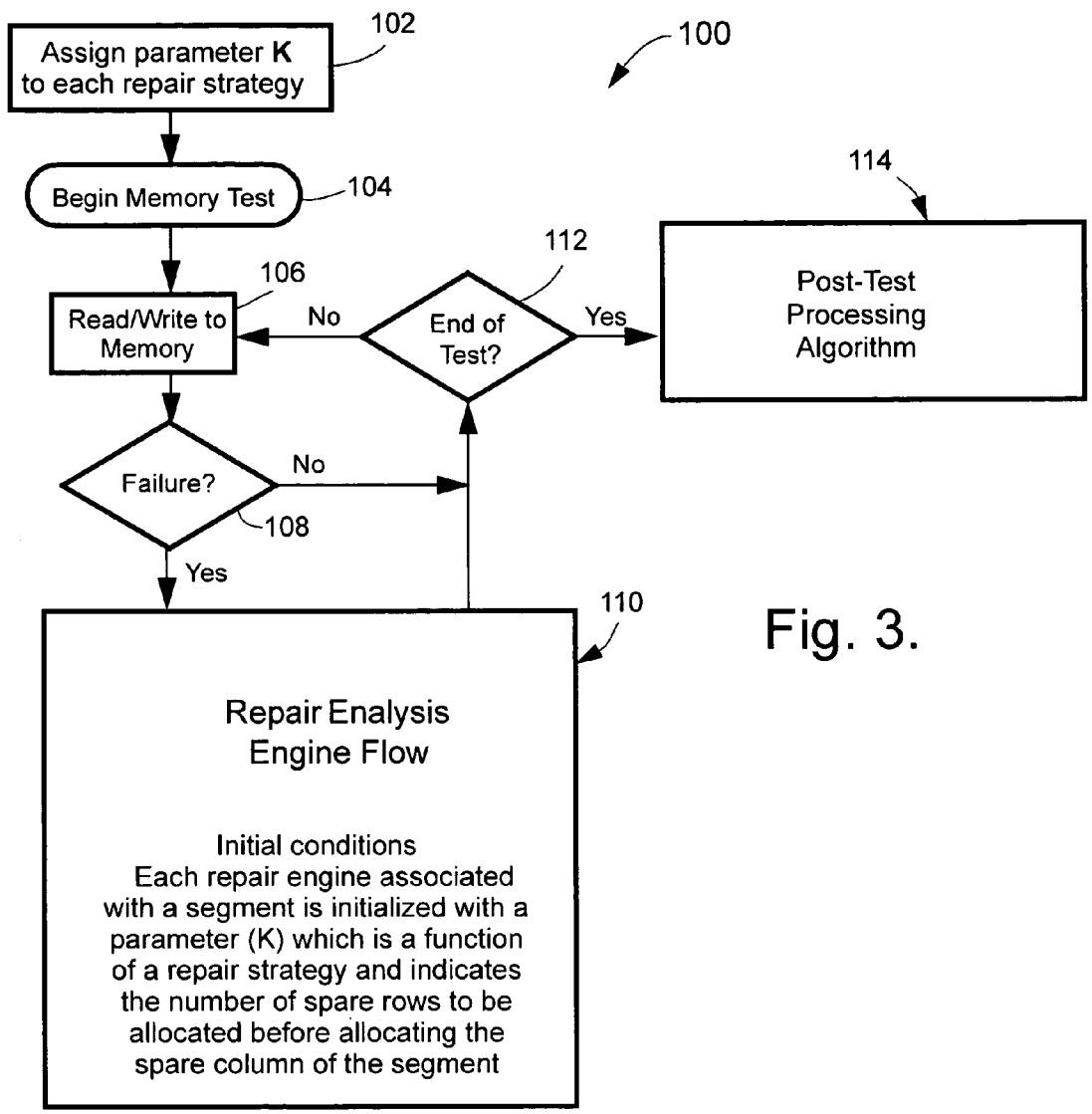
FIG. 3 is a general flow diagram which provides an overview of a method for generating memory segment repair solutions according to an embodiment of the present invention.

FIG. 3 illustrates the general flow 100 for generating a segment repair solution according to the present invention. The analysis is performed while performing a memory test. Prior to performing the memory test, each repair engine is assigned a single parameter, K, (step 102) which indicates the number of spare rows to be allocated before allocating the spare column of the repair strategy and then allocating the remaining of the spare rows. Each repair engine associated with a segment will have a unique parameter value and, therefore, each repair engine will generate a unique segment repair solution. The same set of parameter values may be used for all segments.

Figure 4:
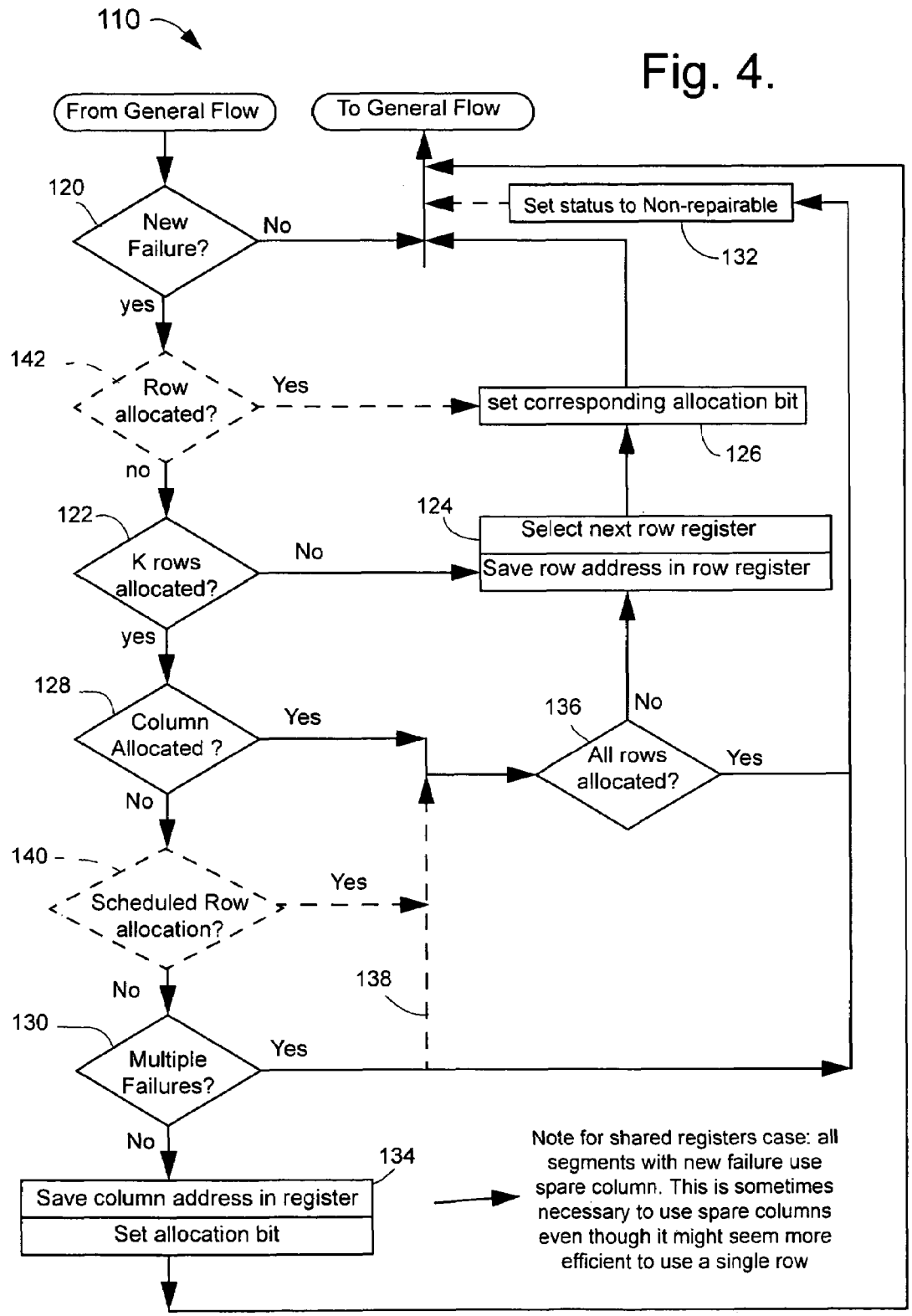
FIG. 4 is a detailed flow diagram of the method for generating memory segment repair solutions according to an embodiment of the present invention.

The memory test begins at step 104 and consists of performing a read and write operation (step 106) on the memory block using any well known algorithm. The resulting memory output is compared against an expected output (step 108). When a failure is detected, the repair analysis engine flow 110, shown in detail in FIG. 4, is executed in each of the repair engines associated with the segment. The repair analysis engine flow is explained in more detail later. When the memory test has completed (step 112), a post-processing algorithm 114, described in more detail later with reference to FIGS. 5 and 6, identifies memory repair solutions based on the segment repair solutions obtained by the repair engines. A memory repair solution consists of a combination of one repair engine solution selected from each segment. The post-test processing algorithm is necessary because the segment repair solutions computed by individual repair engines do not take into account (or only partially in the case of shared row registers) the fact that the spare rows are common to all segments. All repair engines might have a status of "repairable", but a repair solution might not exist if, as indicated earlier, segments contain too many defective rows.

FIG. 4 illustrates a repair analysis engine flow 110 according to an embodiment of the present invention. The repair engine flow includes some optional steps and branching paths identified by dotted lines (e.g., steps 142 and 140 and branching path 138). These optional features are described later. Most of optional features are specific with the shared row register embodiments.

The flow starts with performing a check (step 120) to determine if a failure just detected in the associated segment requires allocation of new spare resources. As mentioned earlier, a failure is "new" when its row address is different from that of all previously stored row addresses and its column address is different from that of the previously stored column address. If the failure is not a new failure, no further action is required and processing returns to the general flow illustrated in FIG. 3. If the failure is new, it is selected for further processing which will now be described. The engine checks whether the first K spare rows have already been allocated (step 122). If the first K spare rows have not been allocated, the engine allocates a new spare row (step 124). This step includes saving the current row address indicated by the address counter in the next available row register and setting the allocation bit (step 126) of that register.

If the first K rows have been allocated, the engine checks whether the spare column has been allocated (step 128). If the column has not been allocated, the repair engine checks whether multiple failures have occurred in the row containing the new failure (step 130) such that allocating the only spare column would not lead to a repair solution. If multiple failures have occurred, the status of the repair engine is set to "non-repairable" (step 132). If multiple failures have not occurred, the repair engine allocates the column (step 134). This step includes saving the column address of the new failure in the column register and setting the column register allocation bit. If the column has already been allocated, the engine checks whether all spare rows have been allocated (step 136). If all spare rows have not been allocated, the engine allocates a new spare row (step 124) in the manner described above.

While not shown, it will be understood that the status of a repair engine is initially set to "no repair needed" and is set to "repairable" when the first failure is detected and then is set to "non-repairable", should that condition occur, in the manner explained above.

The first optional feature is the branching path 138 from step 130 to step 136. That is, instead of declaring the segment "non-repairable" using the programmed strategy, the repair engine deviates from that strategy by attempting to allocate a spare row instead of the column. This is effectively a change in repair strategy. This feature is useful when a subset of all possible strategies is implemented at the same time in order to reduce the number of repair engines. This feature is applicable to both the shared and non-shared row register embodiments.

A second optional feature is step 140 which is a check to determine whether another repair engine associated with another segment, implementing the same repair strategy, is about to allocate a spare row that would repair the failure detected in the segment. If this is the case, the engine executes step 136 and allocates the same row. Depending on implementation, it might be preferable to skip to step 126 instead. Step 140 is primarily applicable to the shared row registers embodiment.

A third optional feature is step 142 which is a check, similar to that of step 142, to determine whether another repair engine previously allocated a spare row to repair the row containing the failure. If this is the case, the allocation bit corresponding to the shared row register containing this address is set (step 126) to indicate that this spare row is needed in this segment.

Post Test Processing

When a memory test has been completed and segment repair solutions have been generated by each of the repair engines, post-test processing procedure 114 is performed. The post-test processing seeks to identify the best union, or combination, of segment repair solutions from each segment.

This requires the formation of all combinations of one segment repair solution from each segment and identification therefrom of potential memory repair solutions. A potential memory repair solution consists of the contents of the row and column registers of a combination of repair engines, one from each segment, whose row registers store compatible row addresses. Some potential memory repair solutions will be better than others. The present invention provides a method for rating potential memory repair solutions. Not all combinations of segment repair solutions which can be formed will be a potential memory repair solutions.

Figure 7:
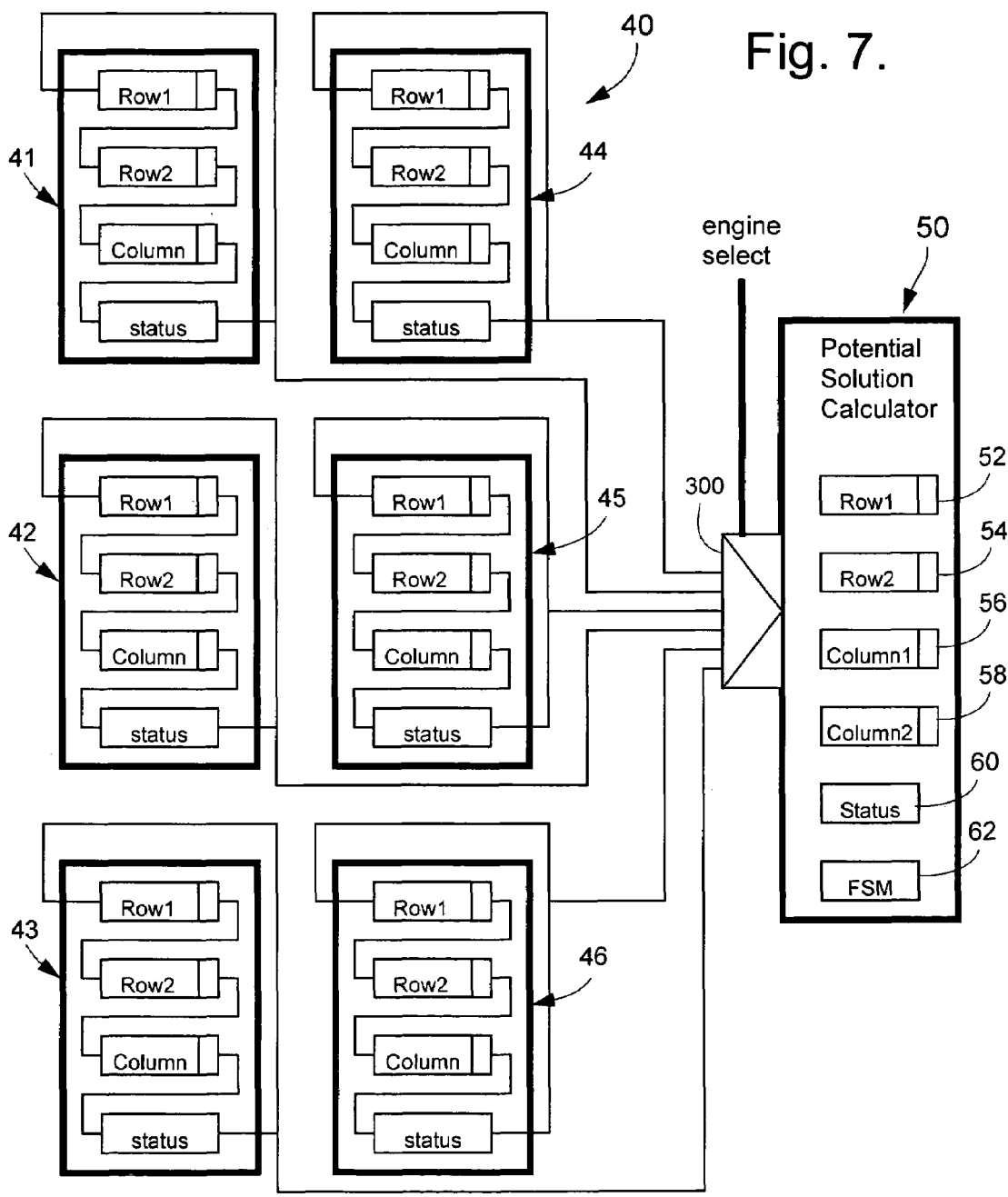
FIG. 7–11 are circuit diagrams illustrating various embodiments of circuitry according to the present invention for selecting a segment repair solution from a repair engines having non-shared and shared row registers.

The starting point for the post-test procedure is (j×m) sets of (n+1) registers containing repair information for each repair engine. Thus, as shown in FIGS. 2 and 7, there will be 6 (3×2) such sets. (n+1) registers refers to the number of row registers and the one column register in each segment repair solution. In an embodiment having shared row registers, some of the registers will be mapped to the same physical register.

The maximum number of potential repair solutions to evaluate is $j^m$ assuming failures are recorded in all segments. In the example of FIG. 2, the number of potential repair solutions is $3^2=9$. These are identified below.

In one embodiment, two sets of (n+m) registers are used to perform post-testing processing: a set of "final solution registers" (not shown) to contain the best repair solution found so far and a set of "working registers" for use in calculating a memory repair solution. The set of working registers is necessary to resolve conflicts between partial solutions of each segment. Thus, for the example of FIG. 2, four registers are required since both n and m are 2. Each of FIGS. 2 and 7 through 11 show the array 40 of six segment repair engines, including repair engines 41, 42 and 43 associated with Segment 1 and repair engines 44, 45 and 46 associated with Segment 2. FIG. 7–11 illustrate potential solution calculator 50 which includes two row registers 52 and 54, and two column registers 56 and 58. Also included are a status register 60 and an FSM 62 which performs the operations described below. Status register 60 serves to store a weight value that is used to compare potential memory repair solutions. A potential memory repair solution will contain the column address and its allocation bit of each repair engine of a combination or union. This is the m component of equation mentioned above. The n component in the equation refers to the number of rows. The set of final solution registers is identical to the working set of registers but does not include the FSM. Accordingly, the set of final solution registers has not been illustrated.

If no failures were detected in a segment, the status of all engines of the segment will be "no repair needed" and, therefore, there is no need to analyze combinations involving more than one engine of such a segment. If the repair status of an engine is "non-repairable", no combinations of that engine will lead to a solution and, accordingly, such combinations need not be analyzed.

Unions of segment repair solutions are formed by assembling combinations of one repair engine solution from each segment and analyzing the repair information contained in the repair engines to identify potential memory repair solutions using potential solution calculator 50. Each combination is assigned a weight or rating reflecting the quality of the memory repair solution provided by the combination. A weight of 0 indicates no solution. The weight associated with the solution of a combination under analysis is compared against the weight of a previously identified solution currently stored in the set of final solution registers. If the weight of the current combination is better, then the repair solution which resides in the set of working registers of the calculator is loaded into the set of final solution registers. In order to reduce the number of wires between the repair engines and the calculator, the repair information of each engine is sent serially to the calculator. Repair engine selection mechanisms are described later.

Figure 5:
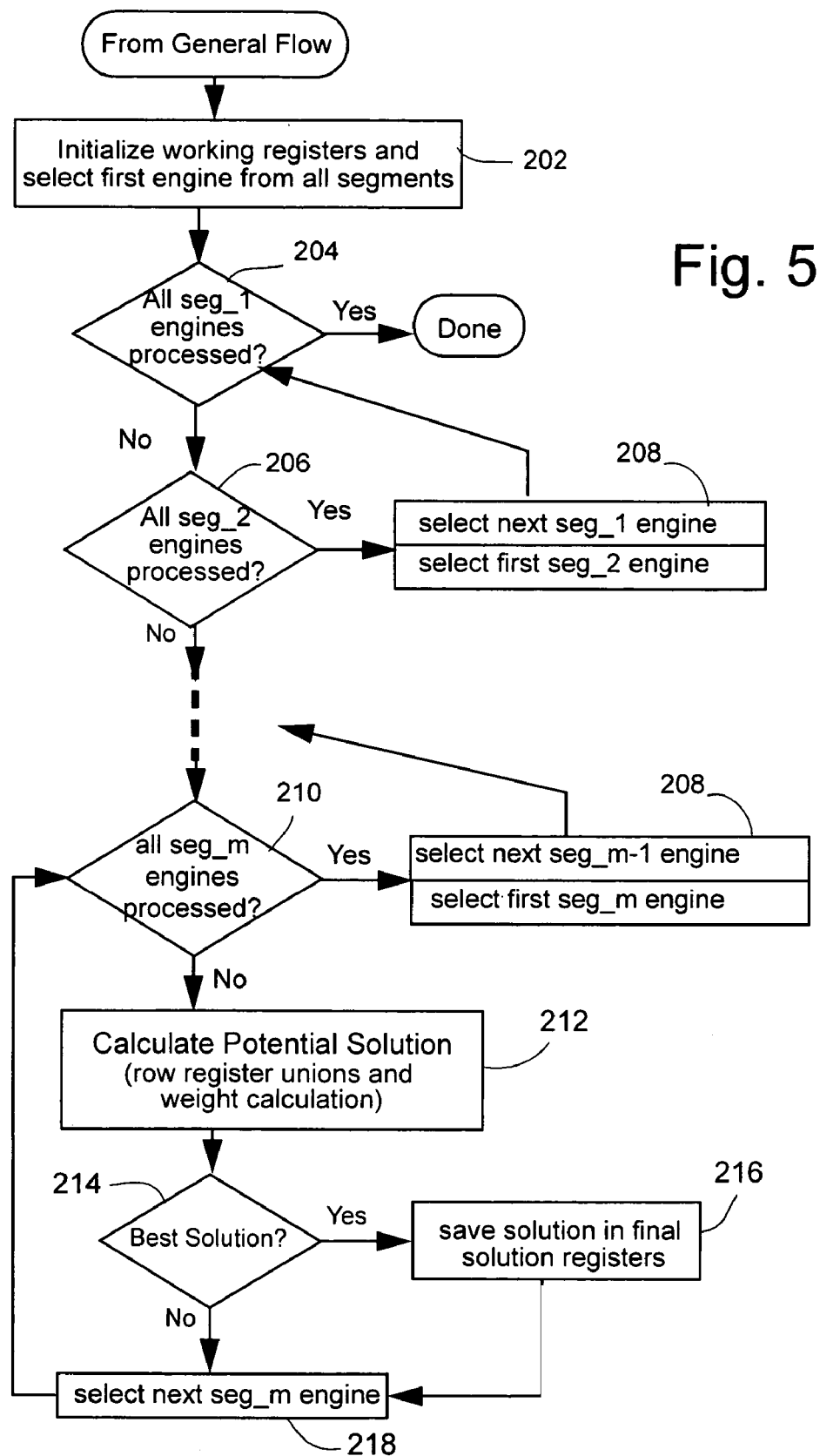
FIG. 5 is a flow diagram illustrating an embodiment of a method according to the present invention for forming combinations of segment repair solutions, in which each combination consists of one segment repair selection generated by the method of FIG. 4, and for rating the combinations and for storing the combination with the best rating.
Figure 6:
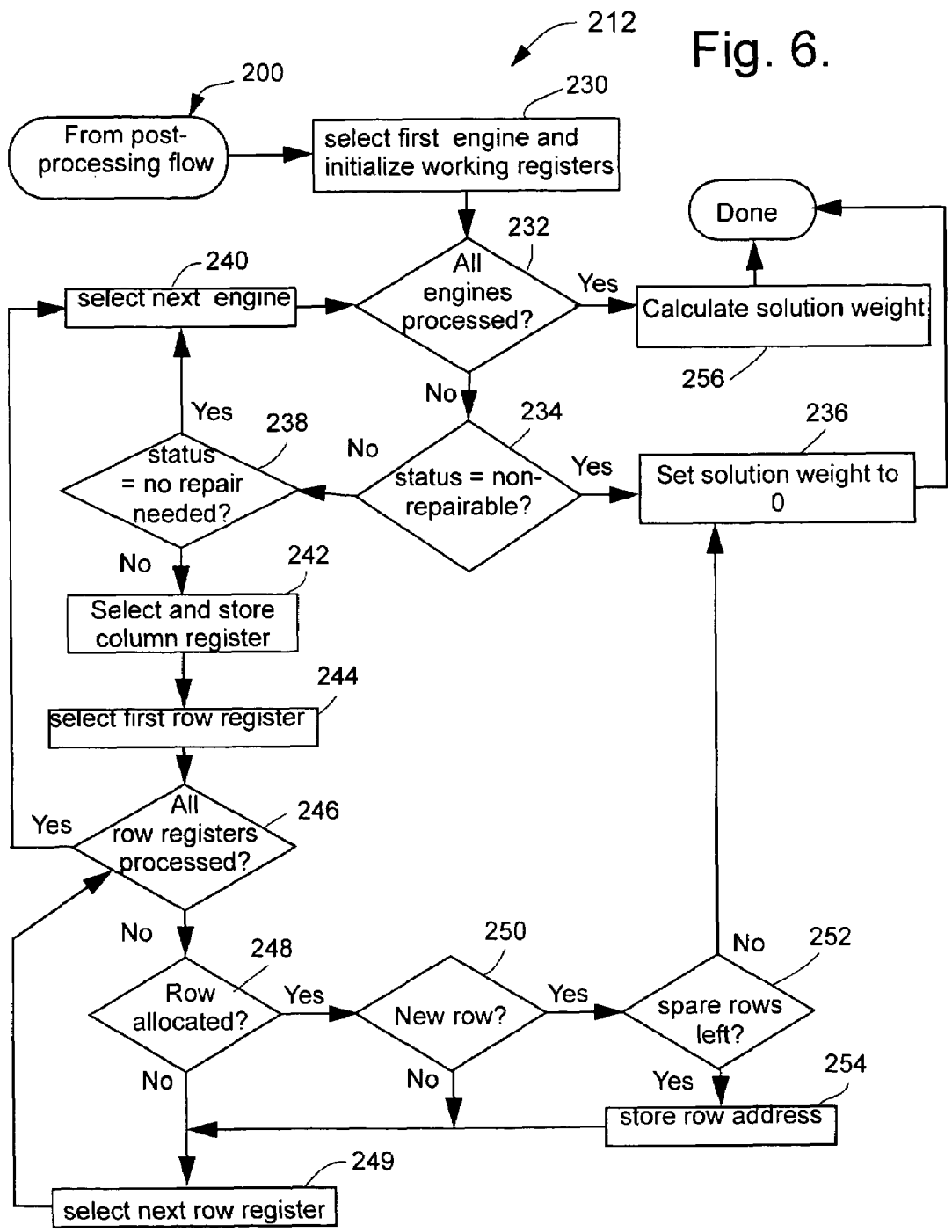
FIG. 6 is a flow diagram of an embodiment of a method according to the present invention for analyzing each segment repair solution which forms part of a combination generated by the method of FIG. 5 and for rating combination after all segment repair solutions of the combination have been analyzed.

In general, the method of FIG. 5, comprises repeatedly forming segment repair solution combinations each consisting of one segment repair selected from each memory segment, and evaluating the combination using the method of FIG. 6. The objective is to identify the best segment repair solution combination having a number of different defective row addresses which is less than or equal to the predetermined number of spare rows. The best combination will identify the rows and columns to be replaced by said spare rows and the spare columns.

It will be understood by those skilled in the art that there are a number of ways of assembling combinations of one repair engine from each segment. FIG. 5 illustrates one such method. The first step 202 initializes the set of working registers and the set of final solution registers and then selects the first engine from each segment to assemble a first combination. Then all repair engines associated with the last segment are selected in sequence and processed using steps 212–218. The latter steps substitute one engine for the existing engine of a segment being processed in the current combination. This continues, until all engines of the segment have been processed. Then, the first engine of the segment is re-selected and the next engine in the next segment to be processed are substituted into the combination for the engines of the respective segments which resided in the combination. This continues until all engines in all segments have been incorporated into a combination of one engine from each segment.

Using the method of FIG. 5, the nine combinations of repair engines which would be formed for the example circuit of FIG. 2 are: 41, 44; 41, 45; 41, 46; 42, 44; 42, 45; 42, 46; 43, 44; 43, 45; 43, 46.

After assembling a combination, all of the repair engines of the combination are analyzed, one at a time, using the method of FIG. 6 (step 212). A rating or weight is assigned to the combination when all of the repair engines of the combination have been analyzed (step 210).

The rating assigned to the combination is compared against that of the solution stored in the set of final solution registers (step 214). If it is better, the new combination is stored in the final solution registers (step 216).

As mentioned, the calculation of the union (combination of segment repair solutions which form a potential memory repair solution) can be performed in a number of ways. The calculation involves comparing all row registers of all segments for a given combination of repair engines.

FIG. 6 is a flow diagram which illustrates the method of operation of the potential solution calculator circuit 50 (step 212 in FIG. 5). The input to the potential solution calculator is the contents of the registers of one repair engine of a combination under analysis. Step 230 initializes the registers in the potential solution calculator and selects the first engine of the combination assembled by the method of FIG. 5. The first steps involve evaluating the status of the engine.

Each repair engine considered has a status of "repairable" or "no repair needed". However, there could be a conflict between different segments in the assignment of spare rows which make the memory non-repairable. As previously mentioned, the post-test processing phase seeks to perform a union of all allocated row registers from the various engines. A potential memory solution is available when the total number of rows required in a combination is less than or equal to the number of spare rows available.

Step 234 determines whether the status of the engine under consideration is "non-repairable" and, if so, step 236 immediately sets the solution weight for the combination to zero and terminates the flow for that combination. If the status is not non-repairable, step 238 determines whether the status of the engine is "no repair needed". If so, step 240 selects the next engine of the combination, if there is another engine to process, as determined by step 232. Thus, only engines having a status of "repair needed" are processed in the manner described below.

Step 242 stores the contents of the column register in one of column registers 56 or 58 of the potential solution calculator. As mentioned previously, one such register is provided for each segment. The column addresses do not require processing because the preliminary processing described earlier confirmed that the allocated spare column will solve at least one detected failure.

The next few steps involve processing each of the row registers of a repair engine being processed to determine whether their contents are valid, if so, whether they contain "new" row addresses. Step 244 selects the first row register of the repair engine under analysis. Step 248 determines whether the data stored in the selected row register is valid by checking whether its allocation bit is set. If the data is invalid, step 249 selects the next row register, unless all row registers of the repair have been analyzed, as determined at step 246.

Step 250 determines whether the row address of a valid row address is a "new" row by comparing the address against the contents of row registers 52, 54. If the address is new and there are spare row registers 52, 54 available (step 252), then step 254 stores the row address in the next available one of registers 52, 54 and proceeds to step 249.

The selection of row registers in the repair engine continues until either all row registers have been processed (step 246) or all spare rows have been used (step 252). When all row registers have been processed (step 246), the flow proceeds to step 240 which selects the next engine of the combination, if any. When all repair engines of the combination have been analyzed (step 232), step 256 calculates a weight for the combination and stores the calculated weight in status register 60, which completes the processing of the combination. The weight of a solution depends on the number/type of spare resources used in a combination. For example, if the use of spare column is preferable over spare rows, the weight could be calculated as follows: weight of 1 for each spare row used and a weight of 3 for each spare column used. It will be understood that a variety of weighting schemes are possible.

At step 250, if row register being analyzed contains the address of a new row and all spare row registers of the potential solution calculator have been filled, (step 252), the combination is assigned a solution weight of zero at step 236 which completes analysis of the combination. Accordingly, the flow returns to the flow of FIG. 5.

In the example of FIG. 2, assume that the addresses of rows 3 and 4 of the two segments have been stored in the row1 and row2 registers of the first engine. Assume also that the combination being evaluated is the combination of the first engine of the two segments and that engine 1 of segment 1 is processed first. At step 250, the contents of row1 will be identified as an address of a new row. Since, at that point, there will be two spare rows registers available in the potential solution calculator (the registers will have been cleared at step 230), step 254 will store the row1 address in row register 52 (FIG. 7). Next, row2 will be selected (step 249). It also will be identified as a new row at step 250, and, since register 54 is empty, step 254 stores the row2 address in register 54, which will fill all row registers of the potential solution calculator. This completes processing of all rows of the first repair engine and, accordingly the flow then moves to step 240, which selects engine 1 of segment 2.

Step 242 stores the column address in the column register of engine 1 of segment 2 in the second column register, register 58, of the potential solution calculator (see FIG. 7). When processing the row1 register at step 250, the result of the "new row" query will be "No" because the same row address is already stored in one or registers 52 and 54, already detected when processing the first engine of segment 1. The same applies to the row2 register.

Repair Engine Selection

All repair engine registers are configurable in a serial mode to allow the data contained in their registers to be serially transmitted to potential solution calculator 50. As shown in FIG. 7, the serial output of each repair engine is connected to a corresponding input of a multiplexer 300 whose output is connected to the potential solution calculator. The serial output of each repair engine is also connected to its serial input so that the registers of the repair engine form a circular shift register. A repair engine is selected by applying an appropriate engine select signal to the control input of multiplexer 300.

The repair engine registers are also configurable in hold mode. Depending on the implementation, each engine will either rotate (or circulate) its data or simply hold its contents when not selected, by applying an appropriate control signal (not shown) to the repair engines.

The embodiment of FIG. 7 requires six wires extending between the repair engines and the potential solution calculator and, in general, j×m wires are required as described earlier. The number of wires extending between the repair engines and the potential solution calculator can be reduced by using the embodiments shown in FIGS. 8 and 9.

Figure 8:
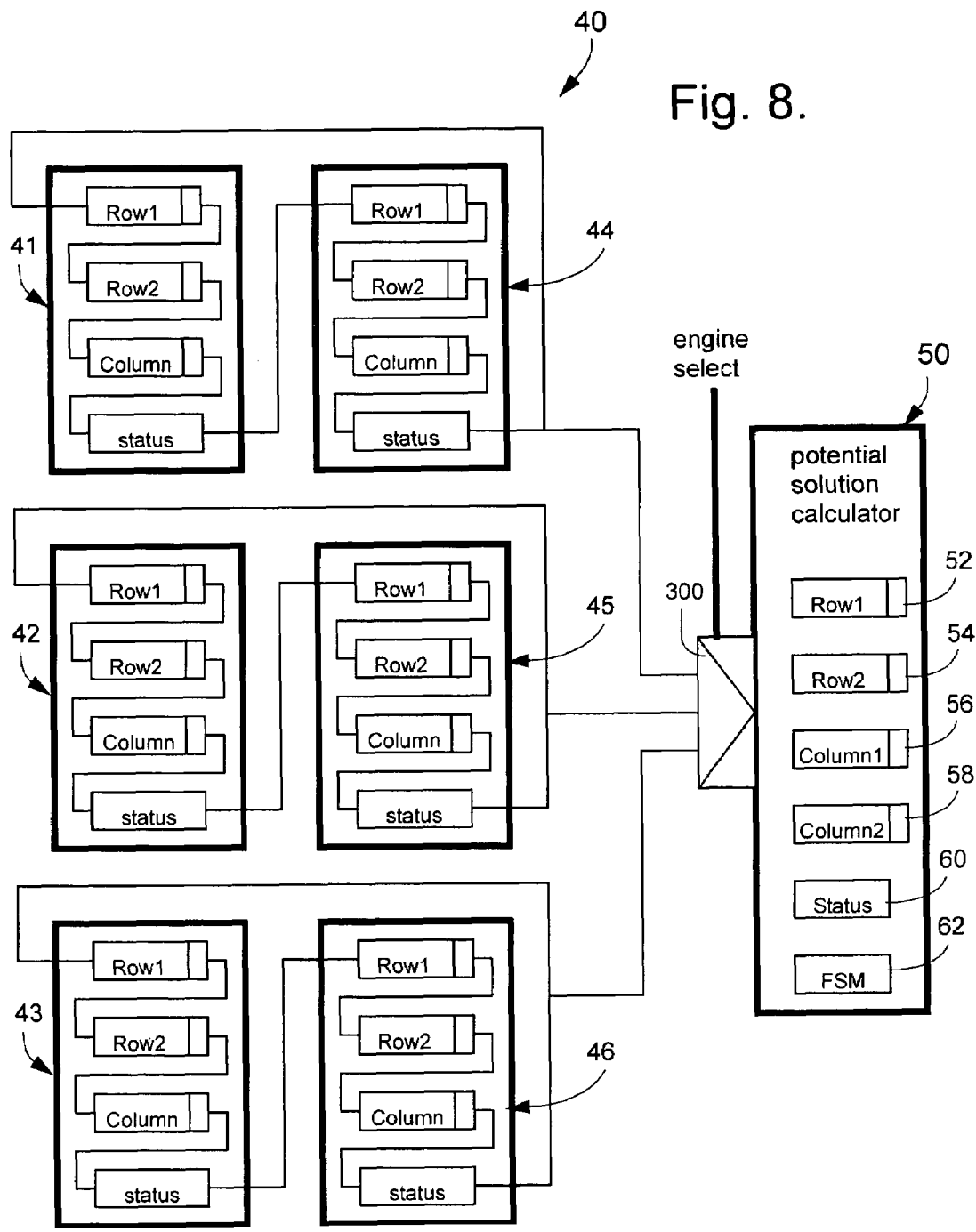

In FIG. 8, repair engines associated with different segments implementing the same strategy (having the same K parameter value), are serially connected together to form a circular shift register before being connected to the potential solution calculator. This is achieved by connecting the serial output of repair engines 44, 45, and 46 in segment 2 to the serial input of repair engines 41, 42 and 43, respectively, in segment 1 and also connecting the serial output of the engines 41, 42, and 43 to the serial input of the engines 44, 45, and 46, respectively. In this way, the data stored in the two engines can be circulated within each other. The serial output of the thus formed circular shift registers is connected to an input of multiplexer 300 of the potential solution calculator. Thus, in this embodiment, only three wires are required to connect the repair engines to the potential solution calculator. In general, only j wires are required. All circular shift registers circulate their data simultaneously whether their output is selected or not such that the registers are back to their initial state after a combination has been transmitted to the potential solution calculator. For example, suppose that the current combination to analyze is the repair information of repair engine 42 of segment 1 and repair engine 46 of segment 2. The engine select signal is set to 3 so that the repair information of engine 46 is shifted into potential solution calculator 50 for processing. The data from engine 46 also shifts into engine 43. Similarly, the data in engine 42 is shifted into engine 45. After the data of engine 46 has been processed, the engine select signal is set to 2 to connect the output of engine 45 to its corresponding input of multiplexer 300. At this point, the engine 42 data resides in engine 45 and the engine 45 data resides in engine 42. Thus, further shifting loads the contents of engine 45 into calculator 50 and into engine 42, where it started. In fact all of engines 41 to 46 are back to their initial state and ready to send another combination to the calculator 50. The present invention contemplates other such combinations.

Figure 9:
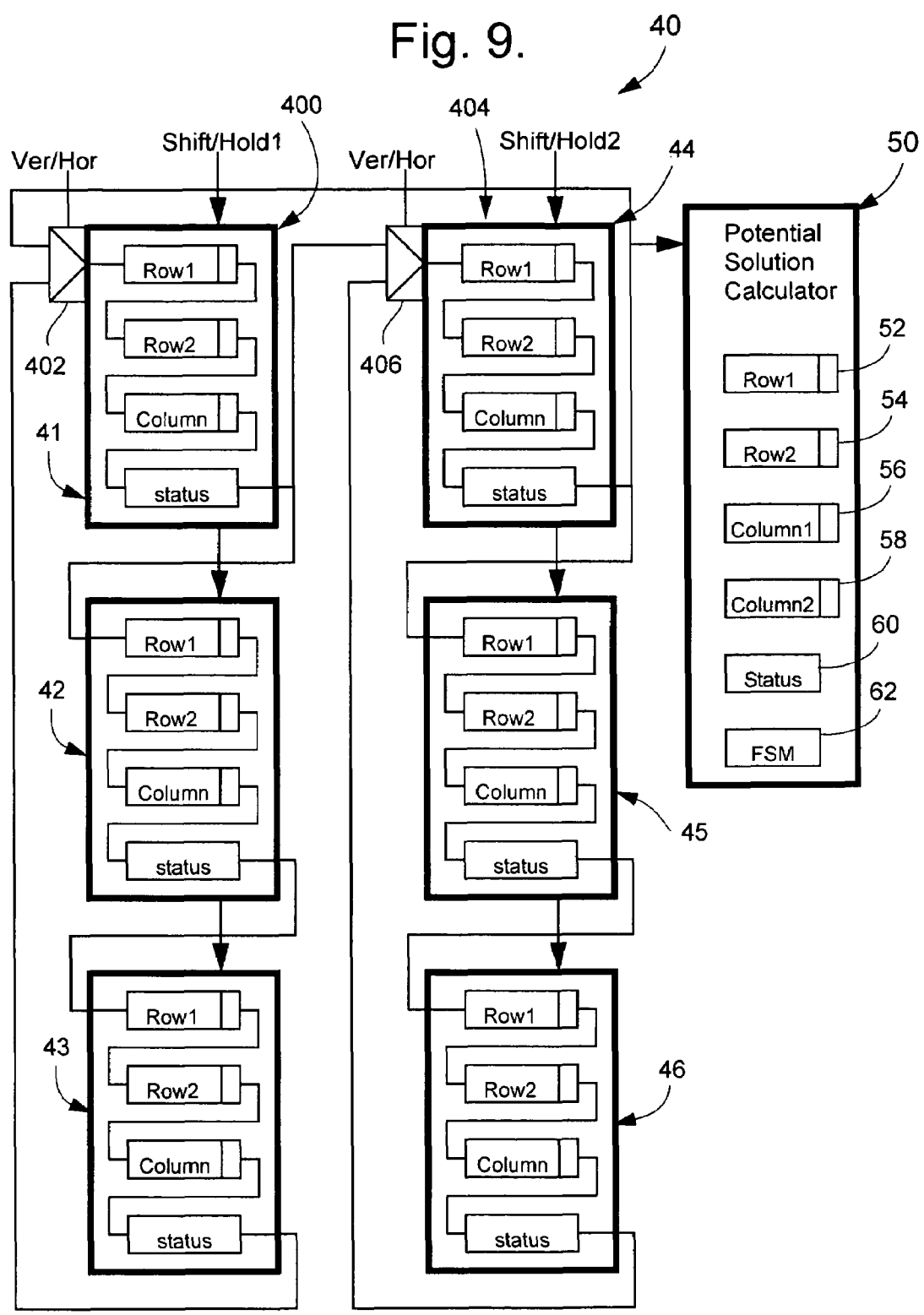

In FIG. 9, the number of wires between the repair engines and the calculator is further reduced to a single wire by implementing vertical and horizontal modes of rotation. A vertical mode of rotation means that the repair engines of each segment can be selectively connected together to form a circular shift register so that the registers of a selected engine can be moved to a position at which it can be aligned with repair engines of other segments. A horizontal mode of rotation means that repair engines of different segments can be selectively serially connected together to form a circular shift register so that the registers of a selected engine can be connected to the potential solution calculator. Thus, the combination of engines to be processed is selected by performing a vertical rotation of all repair engines of each segment so as to align the repair engines which form a desired combination and then, a horizontal rotation is performed to transfer, one repair engine at a time, the repair information contained in the aligned repair engines to the potential solution calculator.

Thus, referring to FIG. 9, repair engines 41–43 of segment 1 form one circular shift register 400. The serial output of engines 41 and 42 are connected to the serial inputs of engines 42 and 43, respectively. The serial output of engine 43 is connected to one input of a multiplexer 402 whose output is connected to the input of repair engine 41. The repair engines 44–46 of segment 2 are connected in the same manner to form a circular shift register 404, with engine 44 being provided with a multiplexer 406. The serial output of repair engine 41 is also connected to one input of multiplexer 406. The serial output of engine 44 is connected to a second input of multiplexer 402. The multiplexers are controlled by a Ver/Hor signal. One value causes vertical circulation and another value causes horizontal circulation.

In addition, each of the engines is controlled by Shift/Hold signals, Shift/Hold1 for the repair engines of segment 1 and Shift/Hold2 for the repair engines of segment 2.

Thus, the data in the repair engines of the two segments can be caused to circulate, under control of one value of the VerHor signal, until the desired repair engines of different segments are aligned. Then, the aligned engines can be caused to circulate, under control of a second value of the VerHor signal, to transfer their data to the calculator in the manner described in FIG. 8. After all repair engines has been processed, they will have been returned to their respective circular shift register.

FIG. 10 illustrates an embodiment of a repair engine selection mechanism for shared row register embodiments corresponding to the selection mechanism of the non-shared row registers embodiment shown in FIG. 8. The horizontal rotation mechanism is slightly modified because of row registers are shared.

Repair engines 44, 45, and 46, associated with segment 2, are shown to contain the actual row registers which are shared with segment 1. The row registers are put on a separate serial path from the status register, column register and allocation bit registers. When transferring status, column and allocation bit registers 410, an inactive row select signal is applied to multiplexers 412 to configure the row registers in a hold mode and to rotate the status, column and allocation bit registers. Conversely, when transferring row registers, an active row select signal is applied to the multiplexers to rotate the row registers and to transfer their contents to the calculator while the other registers are configured in a hold mode.

FIG. 11 illustrates a variation of the FIG. 7 embodiment in which row registers are shared within the same column group as previously indicated in the description of FIG. 2. This type of sharing does not reduce the efficiency of the repair analysis engines. That is, the same solutions will be identified by the embodiment of FIGS. 7 and 11. It is therefore always advantageous to implement this type of sharing and it can be combined with the embodiments shown in FIG. 10.

The Row1 registers of the repair engines implementing repair strategies 1 and 2 (RRC and RCR) are shared. The physical registers are shown to reside in the repair engines implementing strategy 1 as an example. The repair engines implementing strategy 2 receive a row1_select signal that indicates to these engines to hold once the repair information that is unique to them has been read by the potential solution calculator. The remaining row repair information is read from the repair engine that contains the actual Row1 register by changing the engine select signal. As for the other embodiments, the repair information is always back to where it was before transferring the repair information to the calculator.

Variations of the selection mechanism corresponding to the those shown in FIGS. 7 and 10 can be easily developed by a person skilled in the art.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A circuit for use in repairing memory arrays having one or more memory segments each having one spare column and a predetermined number of spare rows common to all segments, said circuit comprising:

an analysis circuit for analyzing failures detected during testing of said memory array and for generating segment repair solutions for each segment;

said analysis circuit having registers for storing addresses of selected failures for each segment repair solution, said registers including row address registers for storing row addresses and one column address register for storing a column address;

said analysis circuit being operable to store row addresses and one column address in a unique order in segment repair solutions associated with the same segment; and a segment repair solution processing circuit for identifying a best segment repair solution combination, consisting of one segment repair solution from each segment, having a number of different defective row addresses which is less than or equal to said predetermined number of spare rows, said best segment repair solution combination identifying rows and columns to be replaced by said spare rows and said spare column in each segment.

2. A circuit as defined in claim 1, said row address registers corresponding in number to said predetermined number of spare rows.

3. A circuit as defined in claim 1, wherein one or more segment repair solutions in the same or different segment share one or more row registers.

4. A circuit as defined in claim 3, wherein row registers are shared between two or more segment repair solutions when said two or more segment repair solutions associated with different segments have the same repair strategy or when row registers associated with said segment repair solutions of the same segment would always store the same row address of a defective row.

5. A circuit as defined in claim 1, each said register having an allocation register which is set when a valid address is stored in said each register.

6. A circuit as defined in claim 1, said analysis circuit further including, for each segment repair solution, a status register for designating whether a status of a corresponding segment repair solution is non-repairable, repairable or no repair needed.

7. A circuit as defined in claim 1, said analysis circuit including a plurality of segment repair engines for generating unique segment repair solutions associated with each segment, each said segment repair engine being logically identical and being operable to execute any of a predetermined number of different repair strategies and having associated defective row address registers and one defective column address register.

8. A circuit as defined in claim 7, each said segment repair engine being responsive to a repair strategy parameter applied to said repair engines prior to initiating a memory test, said parameter indicating a number of spare rows to allocate before allocating the spare column of the segment.

9. A circuit as defined in claim 8, wherein one or more repair engines of the same or different segments share one or more row registers.

10. A circuit as defined in claim 9, wherein row registers are shared between two or more repair engines when two or more repair engines associated with different segments are assigned the same repair strategy parameter or when row registers in said two or more repair engines associated with the same segment would always store the same row address.

11. A circuit as defined in claim 8, each said segment repair engine being operable to determine whether an initially defined repair strategy will not lead to a repair solution and to deviate to an alternative repair strategy when it determines that said initially defined repair strategy will not lead to a repair solution.

12. A circuit as defined in claim 8, said plurality of segment repair engines associated with each segment is one more than said predetermined number of spare rows.

13. A circuit as defined in claim 11, said alternative repair strategy comprising attempting to allocate a row register instead of a column register when multiple failures are detected in a word of said memory when attempting to allocate said spare column.

14. A circuit as defined in claim 8, each said repair engine registers being configurable in serial mode for shifting the contents of said registers to said segment repair solution processing circuit and in hold mode for holding the contents of said registers constant.

15. A circuit as defined in claim 14, said segment repair solution processing circuit further including a segment repair engine selection mechanism for selecting a segment repair engine and serially retrieving data stored in registers of a selected repair engine.

16. A circuit as defined in claim 15, further including means for selectively forming a circular shift register of all registers associated with a repair engine, each said circular shift register having a serial input and a serial output, said serial output being connected to said serial input and to an input to said segment repair solution processing circuit.

17. A circuit as defined in claim 15, further including means for selectively forming a first circular shift register consisting of all registers of all repair engines associated with a segment and for forming a second circular shift register consisting of registers of each of one repair engine of each segment, said second circular shift register having an output connected to said segment repair solution processing circuit.

18. A circuit as defined in claim 17, said means for selectively forming including selector means associated with repair engines of each segment for receiving a serial output of the first circular shift register associated with said each segment and a serial output of a first circular shift register associated with another segment, each said selector means having an output connected to a serial input of its associated first circular shift register, each said selector means being responsive to a control signal for enabling said first circular shift registers or said second circular shift register.

19. A circuit as defined in claim 15, further including means for selectively forming a circular shift register of all registers of each of one repair engine of each segment, said circular shift register having a serial input and a serial output, said serial output being connected to said serial input and to an input to said segment repair solution processing circuit.

20. A circuit as defined in claim 10, wherein repair engines associated with different segments share at least one row register,
    each said repair engine having an allocation register indicating whether a defective address stored in an associated shared row register has been allocated in its respective segment repair solution;
    said segment repair solution processing circuit further including a segment repair engine selection mechanism for selecting one or more segment repair engines for retrieving data stored in the registers of said repair engines, said selection mechanism including:
    means for forming a shared row register circular shift register having a serial output from a last of said shared row registers connected to a serial input of a first of said shared row registers and to an input of a selector controlled by a row select signal,
    said selection mechanism including a second circular shift register consisting of other registers of said repair engines, said second circular shift register having a serial output connected to another input of said of said selector, said selector having an output connected to a serial input of said second circular shift register and to an input of said segment repair solution processing circuit.

21. A circuit as defined in claim 10, further including for repair engines associated with different segments and sharing row registers, means defining a first path containing shared row registers and a second scan path containing all other registers of repair engines sharing said row registers, and selector means responsive to a control signal for connecting said first path or said second path to said segment repair solution processing circuit.

22. A circuit as defined in claim 10, further including, for repair engines associated with the same segment and sharing row registers, further including first selector means responsive to a repair engine select signal for selecting data stored in a first repair engine for transmission to said segment repair solution processing circuit and second selector means for selecting the contents of shared row registers of a second repair engine for transmission to said segment repair solution processing circuit.

23. A circuit as defined in claim 15, said repair engine selection mechanism further including means for selectively forming a shift register of all registers of all repair engines of all segments, said shift register having a serial input and a serial output, said serial output being connected to said serial input and to an input to said segment repair solution processing circuit.

24. A circuit as defined in claim 8, said segment repair solution processing circuit having a circuit for assembling all segment repair solutions combinations consisting of one repair engine selected from each segment; and a potential solution calculator for analyzing and rating each said segment repair solution combination.

25. A circuit as defined in claim 24, said potential solution calculator having:
a set of working registers for receiving the contents of the registers of a selected repair engine;
a set of final solution registers for storing a solution having the best rating;
a selector responsive to a repair engine select signal for receiving a serial output of a selected repair engine; and
circuit means for evaluating a segment repair solution combination stored in said set of working registers; and
a circuit for performing potential solution operations using data loaded into said set of working registers and for storing a best solution in said set of final solution registers.

26. A circuit as defined in claim 8, said segment repair solution processing circuit being operable, for different combinations of repair engines, to select a repair engine from each segment, read the repair information associated with the selected repair analysis circuits, calculate a repair solution using repair information read from selected repair analysis circuits, and assign a weight to a calculated memory repair solution; and store the memory repair solution having the highest weight.

27. A circuit as defined in claim 8, said repair engine being configurable to execute a repair strategy independently of or cooperatively with other repair analysis circuits of the same or other segments.

28. A circuit for use in repairing a memory arrays having one or more memory segments each having one spare column and a predetermined number of spare rows common to all segments, said circuit comprising:
at least one segment repair engine associated with each segment for analyzing failures detected during testing of a memory array and for generating a segment repair solution, each said repair engine having registers for storing addresses of selected failures, said registers including row address registers corresponding in number to said predetermined number of spare rows and one column address register;
said segment repair engines being logically identical and being operable to execute any of a predetermined number of different repair strategies and being responsive to a repair strategy parameter applied thereto prior to a memory test, said parameter indicating a number of row addresses to store before storing a column address of its associated segment; and
a segment repair solution processing circuit for identifying a best segment repair solution combination, consisting of one segment repair solution from each segment, having a number of different defective row addresses which is less than or equal to said predetermined number of spare rows, said combination identifying rows and columns to be replaced by said spare rows and said spare column in each segment.

29. A circuit as defined in claim 28, further including:
each said row and column register including an allocation register indicating whether its associated row or column register contains a valid address;
each said repair engine further including a status register for classifying a segment repair solution as non-repairable, repair needed or no repair needed.

30. A circuit as defined in claim 29, said segment repair solution processing circuit including:
a segment repair solution combination generating circuit for generating all possible segment repair solution combinations consisting of one segment repair solution selected from each segment; and
a circuit for analyzing and weighting each said combination, one segment repair solution at a time, said analyzing and weighting circuit:
assigning a lowest weight to a combination having a repair engine is designated non-repairable or to a combination having a repair engine requiring more spare rows than are available;
assigning a weight greater than a lowest value when a number of spare rows required by all segment repair solutions of a combination is less than or equal to said predetermined number of spare rows; and
comparing the weight of a combination against the weight of a best memory repair solution and storing the combination as a best memory repair solution if the weight of the combination is better than that of said memory repair solution.

31. A method of repairing a memory array having one or more memory segments each having one spare column and a predetermined number of spare rows common to all segments, said method comprising:
while testing the memory array for failures:
generating an equal number of unique segment repair solutions for each segment, each segment repair solution including one defective column address, if any, and a number of defective row addresses, if any, corresponding to said predetermined number of spare rows; and
after completing testing:
analyzing all combinations of segment repair solutions in which each combination includes one segment repair solution selected from each segment; and
identifying a best segment repair solution combination, consisting of one segment repair solution from each segment, having a number of different defective row addresses which is less than or equal to said predetermined number of spare rows, said best combination identifying rows and columns to be replaced by said spare rows and said spare column in each segment.

32. A method as defined in claim 31, said generating unique segment repair solutions including storing a unique number of defective row addresses before storing a defective column address.

33. A method as defined in claim 31, said generating a unique segment repair solution including, for a selected failure in an associated segment,
storing the row address of said selected failure when the number of previously stored row addresses is less than a number of row addresses unique to said segment repair solution;
otherwise, when the number of previously stored row addresses is greater than said unique number and a column address has not been previously stored, storing the column address of said selected failure;
otherwise, when a column address has been previously stored and the number of previously stored row addresses is less than said predetermined number of spare rows, storing the row address of said selected failure.

34. A method as defined in claim 33, each said storing a row address and said storing a column address including setting a corresponding allocation bit indicating that a valid address has been stored.

35. A method as defined in claim 31, said generating potential memory repair solutions including storing the defective column address of each segment repair solution in said combination and each of said same defective row addresses.

36. A method as defined in claim 31, said determining which of the potential memory repair solutions provides the best solution including rating each potential memory repair solution according to predetermined criteria.

37. A method as defined in claim 33, each said segment repair solution being identical except for the number of defective row addresses to store prior to storing a defective column address.

38. A method as defined in claim 33, declaring a segment repair solution non-repairable when multiple failures have occurred in a word prior to storing a column address.

39. A method as defined in claim 33, further including, declaring a segment repair solution non-repairable when a selected failure occurs after said number of defective row addresses have been stored, a defective column address has been stored and a number of defective row addresses corresponding to the predetermined number of spare rows have been stored.

40. A method as defined in claim 33, further including, determining whether an initially defined segment repair strategy will not lead to a repair solution and deviating to an alternative repair strategy when it is determined that said initially defined repair strategy will not lead to a repair solution.

41. A method as defined in claim 40, said alternative repair strategy comprising attempting to store a row address instead of a column address when multiple failures are detected in a word of said memory when attempting to store a column address.

42. A method of repairing a memory array having one or more memory segments, one spare column and a predetermined number of spare rows common to all segments, said method comprising:
while testing said memory array for failures:
generating an equal number of unique segment repair solutions for each segment, each segment repair solution including one defective column address, if any, and a number of defective row addresses, if any, corresponding to said predetermined number of spare rows, said generating segment repair solutions including storing a defective column address or defective row addresses in a unique order in which a unique number of defective row addresses are stored before storing a defective column address to a maximum of said number of row addresses and said column address; and
after completing said testing:
creating all segment repair solution combinations consisting of one segment repair solution selected from each segment;
generating potential memory repair solutions by determining which of the combinations contain compatible row addresses, storing the defective column address of each segment repair solution in said combination, and each of said compatible row addresses; and
rating each potential memory repair solution according to predetermined criteria to which of the potential memory repair solutions provides the best memory repair solution.

43. A method as defined in claim 42, said generating a unique segment repair solution including, for a selected failure in an associated segment,
storing the row address of said selected failure when the number of previously stored row addresses is less than a number of row addresses unique to said segment repair solution;
otherwise, when the number of previously stored row addresses is greater than said unique number and a column address has not been previously stored, storing the column address of said selected failure;
otherwise, when a column address has been previously stored and the number of previously stored row addresses is less than said predetermined number of spare rows, storing the row address of said selected failure.

44. A method as defined in claim 42, further including, prior to said performing said test, specifying for each said segment repair strategy of each said segment, a number of defective row addresses to store before storing the address of a defective column of the segment, and then storing a second number of additional defective row addresses corresponding to the difference between said predetermined number of spare rows and first number of defective row addresses.

45. A method as defined in claim 42, said generating segment repairs solutions including assigning a status to each segment repair solution including a no repair needed status when a corresponding segment does not require repair, a repair needed status when the number of stored addresses is less than or equal to a predetermined number of addresses and a non-repairable status when the number of addresses which need to be stored is greater than said predetermined number of addresses.

46. A method as defined in claim 45, said determining including considering only combinations which have a repair needed strategy status or a no repair needed status.

* * * * *